United States Patent
Sasaki et al.

(10) Patent No.: US 7,254,035 B2
(45) Date of Patent: Aug. 7, 2007

(54) CIRCUIT SUBSTRATE UNIT AND ELECTRONIC EQUIPMENT

(75) Inventors: Chiyoshi Sasaki, Kanagawa (JP); Kouji Hirata, Aichi (JP); Katsushi Itoh, Tokyo (JP); Yasuhiro Ootori, Kanagawa (JP); Ryouichi Kubota, Chiba (JP)

(73) Assignee: Sony Computer Entertainment Inc., Tokyo (JP)

(*) Notice: Subject to any disclaimer, the term of this patent is extended or adjusted under 35 U.S.C. 154(b) by 1048 days.

(21) Appl. No.: 10/037,481

(22) Filed: Oct. 24, 2001

(65) Prior Publication Data

US 2002/0089825 A1   Jul. 11, 2002

(30) Foreign Application Priority Data

Oct. 25, 2000   (JP) ............................. 2000-325992

(51) Int. Cl.
*H05K 7/20*   (2006.01)

(52) U.S. Cl. ...................... 361/721; 361/695; 361/719; 165/80.3; 165/185

(58) Field of Classification Search ............... 165/80.3; 62/259.2; 174/16.3, 35 R, 15.2; 257/722; 454/184; 361/687, 694, 690, 692, 695, 697, 361/701, 704, 705, 700, 717–721, 784, 785, 361/800, 816, 818

See application file for complete search history.

(56) References Cited

U.S. PATENT DOCUMENTS

| | | | |
|---|---|---|---|
| 4,599,680 A |   | 7/1986 | Gibson et al. |
| 4,849,858 A |   | 7/1989 | Grapes et al. |
| 5,218,516 A | * | 6/1993 | Collins et al. ............... 361/721 |
| 5,801,924 A |   | 9/1998 | Salmonson |
| 6,088,227 A |   | 7/2000 | Bujtas et al. |
| 6,205,027 B1 | * | 3/2001 | Nakajima .................... 361/719 |
| 6,357,514 B1 | * | 3/2002 | Sasaki et al. ............... 165/80.3 |
| 6,400,566 B1 | * | 6/2002 | Ootori ........................ 361/695 |
| 6,411,522 B1 | * | 6/2002 | Frank, Jr. et al. ........... 361/800 |

FOREIGN PATENT DOCUMENTS

| | | |
|---|---|---|
| EP | 0 340 959 A2 | 11/1989 |
| JP | 58-10380 | 2/1983 |
| JP | 59-67992 | 5/1984 |
| JP | 62-71300 | 4/1987 |
| JP | 63-28098 | 2/1988 |
| JP | 2-2888 | 1/1990 |
| JP | 06-302728 | 10/1994 |
| JP | 9-45827 | 2/1997 |
| JP | 9-64582 | 3/1997 |
| JP | 10-4281 | 1/1998 |
| JP | 10-308485 | 11/1998 |
| JP | 11-074667 | 3/1999 |
| JP | 11-112174 | 4/1999 |
| JP | 2000-196269 | 7/2000 |

OTHER PUBLICATIONS

Supplementary European Search Report dated Mar. 13, 2006, from corresponding European Application No. 01978909.8-2214.

* cited by examiner

*Primary Examiner*—Michael Datskovskiy
(74) *Attorney, Agent, or Firm*—Katten Muchin Rosenman LLP

(57) ABSTRACT

Provided is a structure in which a shield 308 and a heat sink 307 integrated with a radiation fin 306 are sandwiched by a main substrate 381a and a power source substrate 381b. A hood 142d covers the radiation fin 306 so as to collect air for cooling. Major parts of the main substrate 381a are in contact with the heat sink 307 via heat conduction members having different heat conductivity so that an even thermal distribution is provided. Thus, parts of electronic equipment can be efficiently disposed in a limited space. Moreover, the parts of the electronic equipment can be effectively cooled.

22 Claims, 15 Drawing Sheets

FRONT

FRONT

FRONT

FRONT

CIRCUIT SUBSTRATE UNIT AND ELECTRONIC EQUIPMENT

TECHNICAL FIELD

The present invention relates to a circuit substrate unit and electronic equipment provided with the circuit substrate unit.

BACKGROUND ART

Sales of electronic equipment are influenced not only by its functions but also by its exterior designs, especially when such electronic equipment is a product for individual end users. For example, when the electronic equipment is an entertainment apparatus used for games, music reproduction, video reproduction or telecommunication, such electronic equipment is largely influenced by its external design in particular.

Therefore, external designs are carefully determined. Once the external design is determined and a product is released to the market, it is not desirable to change the external design because the design itself establishes an identity as a symbol of the entertainment apparatus. Moreover, even if the electronic equipment maintains the same external design, for example, changing its size without careful consideration may cause the equipment to lose compatibility with accessories such as external attachments. A casing embodying the external design must be therefore basically unchanged for a lifecycle of the entertainment apparatus.

However, speed of technological progress of the electronic equipment is very fast as compared with the lifecycle of the entertainment apparatus. An entertainment apparatus of this kind tends to be desired to show higher performance based on advanced technologies in reproducing beautiful animations with more reality and in executing technologically advanced games.

Therefore, design change is sometimes desired for applying parts with higher performance than those adopted at the time of its release. Moreover, as a style of usage of the entertainment apparatus has become diversified, some users demand mounting of an apparatus having a new function such as an external storage device, a communication apparatus and the like.

DISCLOSURE OF THE INVENTION

Even when adding new apparatuses to the entertainment apparatus in response to such demands, it is not desirable as described above to change the casing of the entertainment apparatus for the purpose of securing a space for housing such newly added apparatuses. Although it may be possible to consider a possibility that the entertainment apparatus is provided with some extra space therein from the beginning, portability of the apparatus must be secured due to its characteristics, so that the casing thereof is designed to have the smallest size possible. Furthermore, since necessity of the additional apparatuses or kinds thereof to be added are determined depending on market trends and requests from the users, it is difficult to determine the same in advance. For these reasons, it is not general practice to ensure a special space in the entertainment apparatus for housing such additional apparatuses therein. When the new apparatuses are added, therefore, it is inevitable to arrange conventionally provided parts in a smaller and more limited space than before in order to secure a space to arrange the newly added apparatuses therein.

However, the parts conventionally provided in the entertainment apparatus include parts that generate heat during operation, such as a central processing unit. For preventing the heat from causing operation errors and shortening of a lifetime, these parts must be cooled by suitably releasing the generated heat. When the parts that have been provided in the entertainment apparatus are arranged in a small space, however, cooling efficiency becomes deteriorated.

A first object of the present invention is to provide a technology for efficiently arranging parts of electronic equipment in a limited space.

A second object of the present invention is to provide a technology for effectively cooling parts of electronic equipment.

According to the present invention for achieving the above objects, there is provided a circuit substrate unit for circuit-element-mounting, which comprises a plurality of circuit substrates, each of which mounts a circuit element thereon; and at least one heat sink member, wherein at lease one of the plurality of circuit substrates is stacked on one of the circuit substrates adjacent thereto with a space therebetween, and the heat sink member is arranged in at least one of the spaces formed between the adjacent circuit substrates.

BRIEF DESCRIPTION OF THE DRAWINGS

FIG. 7 is a schematic view of layout of major parts of a main substrate 381a.

BEST MODE FOR EMBODYING THE INVENTION

An embodiment of the present invention will be explained with regard to a case of application of the present invention to an entertainment apparatus, electronic equipment, with reference to the accompanying drawings. The present invention is not limited to the entertainment apparatus, while the present invention is more effective when it is applied to an apparatus such as an entertainment apparatus in which an external appearance, a size and parts used therein are limited to some degrees for the purpose of widely popularizing such an apparatus.

Figure 1:
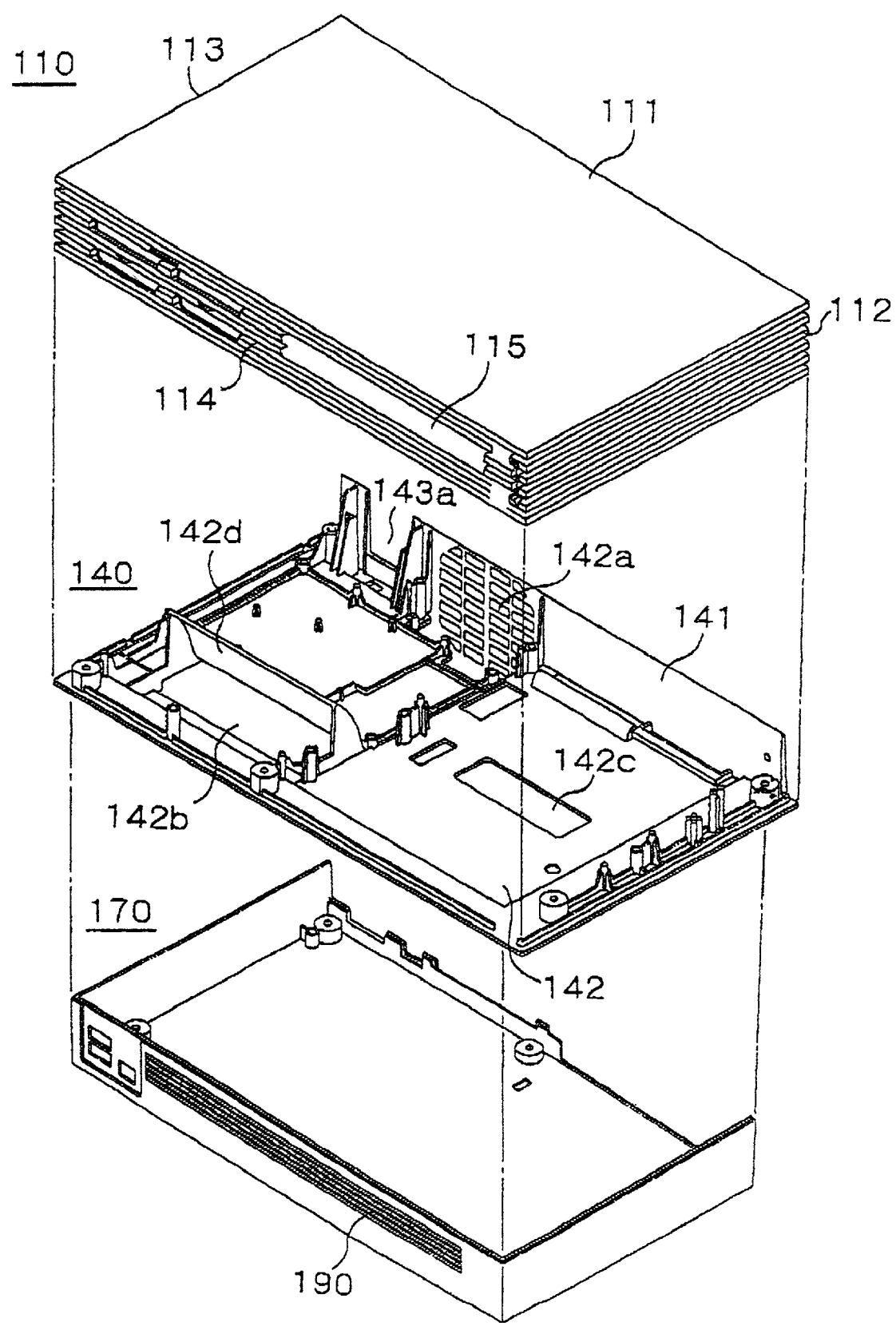
FIG. 1 is an explanatory view showing shapes of three constituent members of a casing 100 of an entertainment apparatus.

A casing 100 of the entertainment apparatus in this embodiment is composed of three portions as shown in FIG. 1. Specifically, the casing 100 is composed of an upper casing 110, a central chassis 140 and a lower casing 170. Each of the upper casing 110 and the lower casing 170 generally has a flat rectangular parallelepiped shape. The upper casing 110, the central chassis 140 and the lower casing 170 are integrated by fixation with bolts (not shown).

The upper casing 110 has an upper surface portion 111, a right-side surface portion 112, a left-side surface portion 113 and a front portion 114, and has a box-type structure having an opened back surface. In the front portion 114, an opening portion 115 and the like for inserting a disc-type recording medium therein are provided. A plurality of horizontal concave and convex portions are provided on the right-side surface portion 112, the left-side surface portion 113 and the front portion 114.

In the following descriptions including descriptions of inner parts such as a main substrate, the word "front" refers to the direction of the front portion 114 in FIG. 1, and the word "upper" refers to the direction of the upper surface portion 111 in FIG. 1. The meaning of the word "lower" is based on these defined directions.

Figure 2:
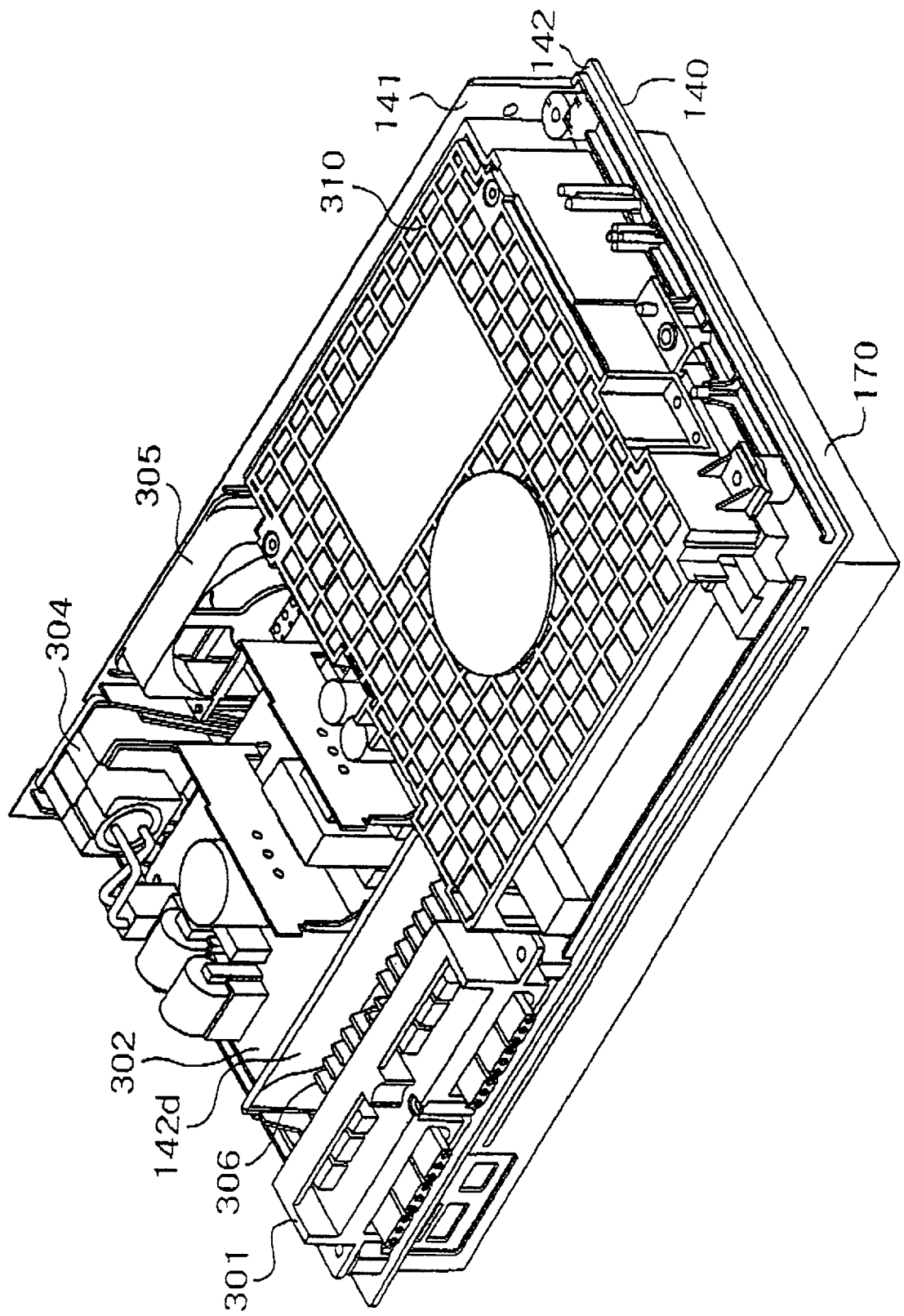
FIG. 2 is a perspective view showing a state where an upper casing is removed from the casing 100 of the entertainment apparatus.

The central chassis 140 has a back portion 141 and an intermediate plate 142. This intermediate plate 142 partitions a space inside the casing 100 into an accommodation space on the upper casing 110 side and an accommodation space on the lower casing 170 side. This intermediate plate 142 carries various kinds of equipment to be accommodated in the upper casing 110. The equipment mounted on the intermediate plate 142 includes, for example, a disc unit 310, a slot unit 301, a power source unit 302 and a switch inlet unit 304, as shown in FIG. 2. Further, through holes 142b and 142c are made in the intermediate plate 142 (see FIG. 1), and, a hood 142d is provided to the intermediate plate 142 so as to cover the through hole 142b. A radiation fin 306 (see FIG. 2) provided in the lower casing 170 penetrates the through hole 142b, and an upper portion of the radiation fin 306 is housed in the hood 142d. Furthermore, a through hole 142a is made in the intermediate plate 142, and a cooling fan 305 is disposed. The slot unit 301 is fixed to the intermediate plate 142 by being screwed to protrusions provided on an upper surface of the intermediate plate 142.

The disc unit 310 is a recording medium driving apparatus or reproducing a disc-type recording medium such as a CD and a DVD, and has a tray (not shown) capable of sliding in and out. The disc-type recording medium is loaded onto the tray. The disc unit 310 incorporates a reproducing portion which accommodates the tray and reproduces the disc such as the CD and the DVD.

Figure 3:
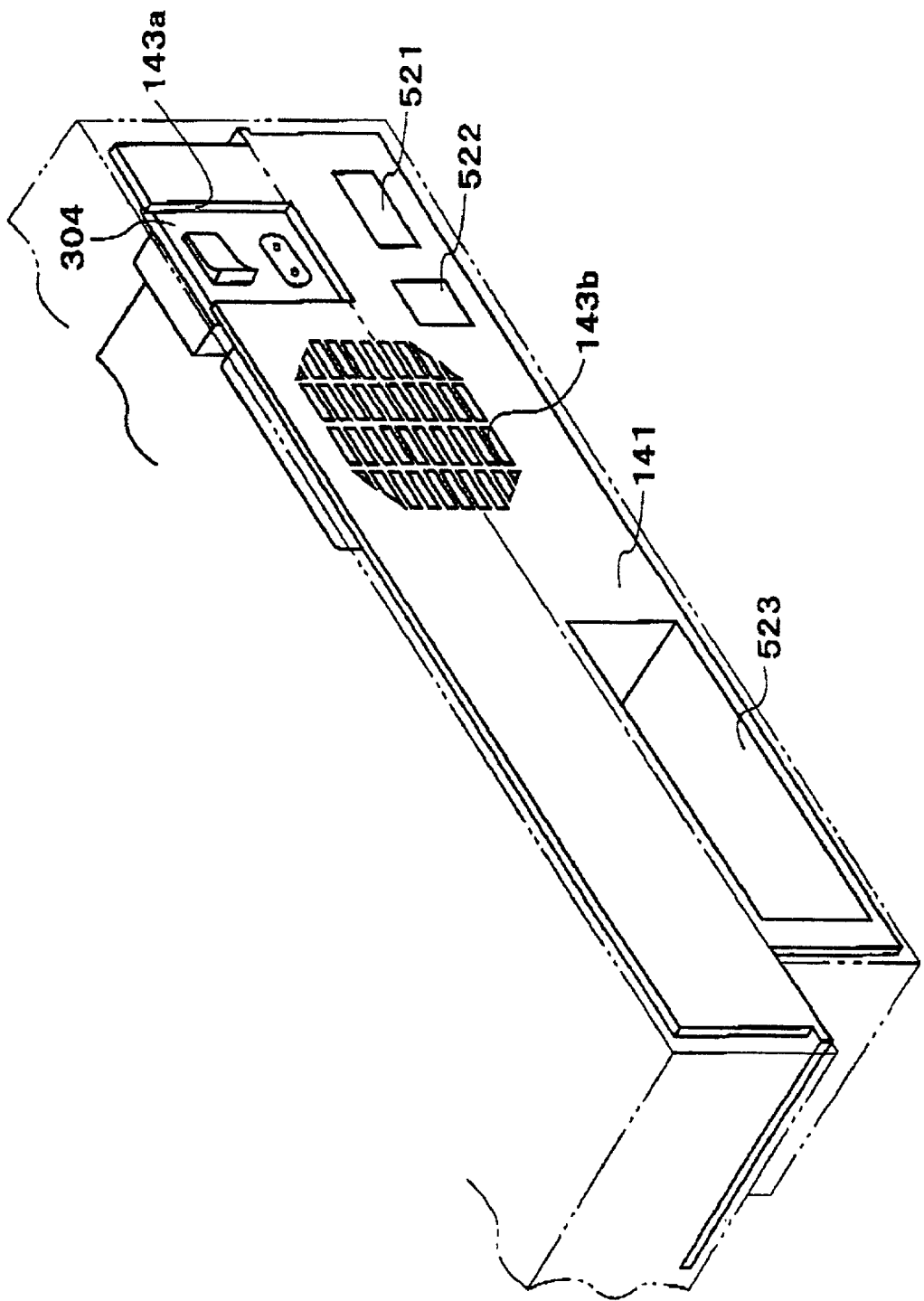
FIG. 3 is a perspective view showing a backside of the casing 100 of the entertainment apparatus.

A notch portion 143a is provided in the back surface portion 141 of the central chassis 140 as shown in FIG. 3. The switch inlet unit 304 is exposed to the outside from this notch portion 143a. An exhaustion port 143b is provided at a location where the back surface portion 141 faces the cooling fan 305. Besides, various communication terminals 521 and 522 are provided in a lower back surface member 144 as shown in FIG. 3. An opening portion 523 for serving as an insertion port for a removable external storage device is provided in the back surface portion 141. The opening portion 523 is covered with a cover (not shown) in regular use.

Figure 4:
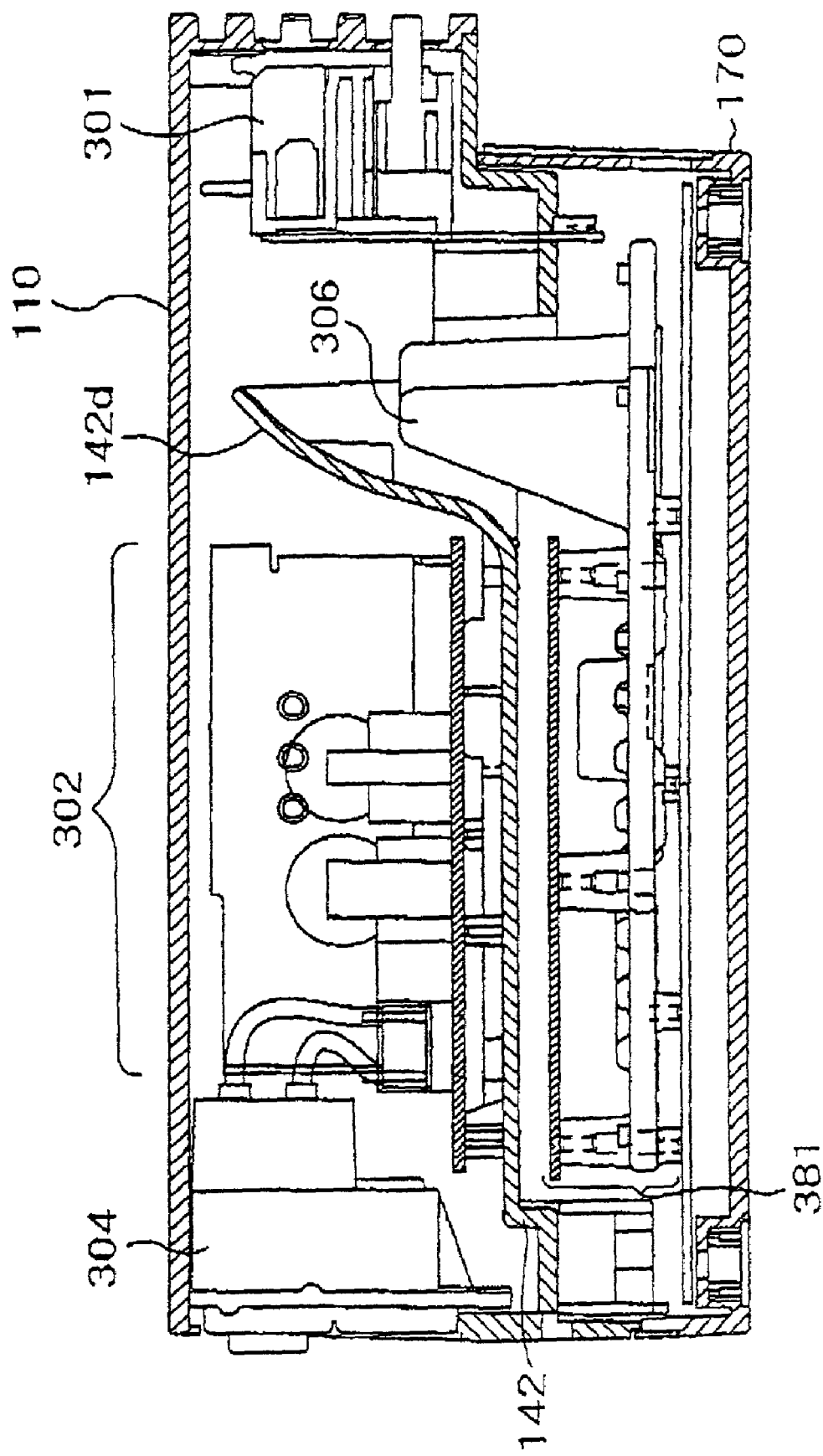
FIG. 4 is a cross-sectional view showing the entire constitution of the entertainment apparatus.
Figure 5:
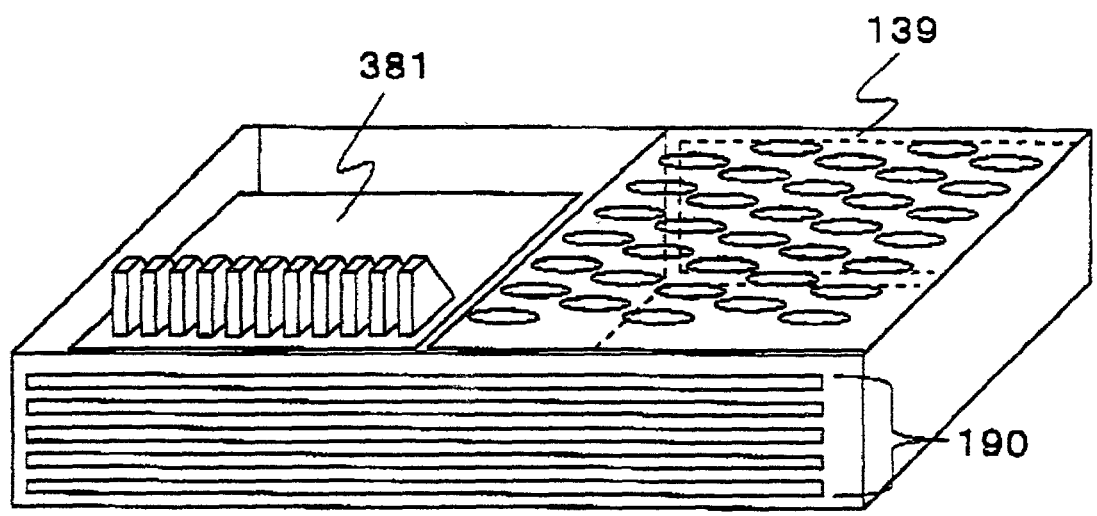
FIG. 5 is a perspective view showing a state where an intermediate plate of the casing 100 of the entertainment apparatus is removed.

In the lower casing 170, a main board 381 having a central processing unit 401 mounted thereon is arranged as shown in FIG. 4. Further, in the lower casing 170, ventilation ports 190 and a housing case 139 of the removable external storage device are provided together with the main board 381 as shown in FIG. 5.

As described above, by making it possible to incorporate related apparatuses, such as the external storage device, within the casing, the present invention is particularly effective when a space for arranging the circuit substrate and the like in the casing is limited.

Figure 6:
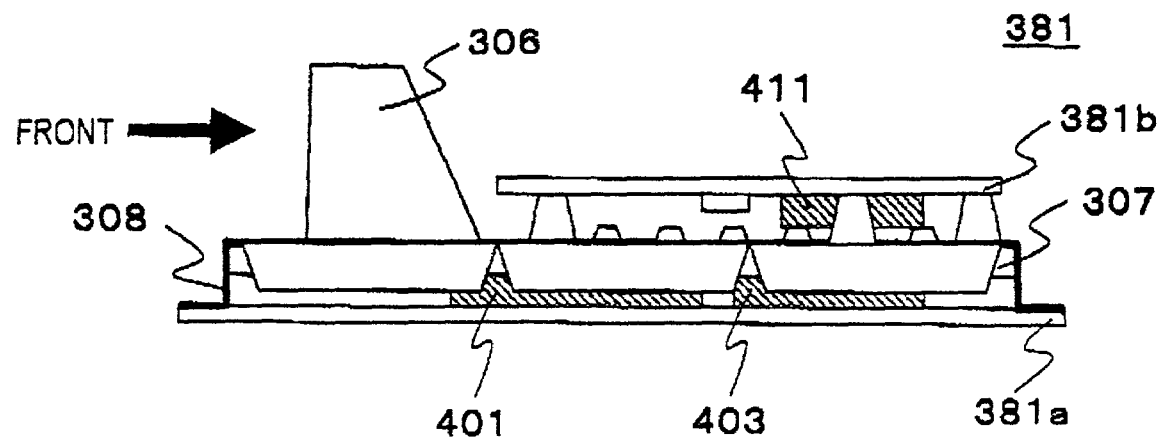
FIG. 6 is a side view of a main board 381.

The main board 381 is constituted by a main substrate 381a and a power source substrate 381b as shown in FIG. 6. These substrates 381a and 381b constitute a two-layered structure with a space therebetween. In the space between these two substrates, a shield 308 made of a metal plate and a heat sink 307 integrated with the radiation fin 306 are arranged. As described above, by adopting the structure in which the circuit substrates constitute the two-layered structure, and the heat sink and the shield are sandwiched therebetween, it is possible to efficiently accommodate necessary circuits in a limited space. Naturally, the present invention is not limited to the two-layered structure, and can be applied to a main board having a multi-layered structure.

Figure 7:
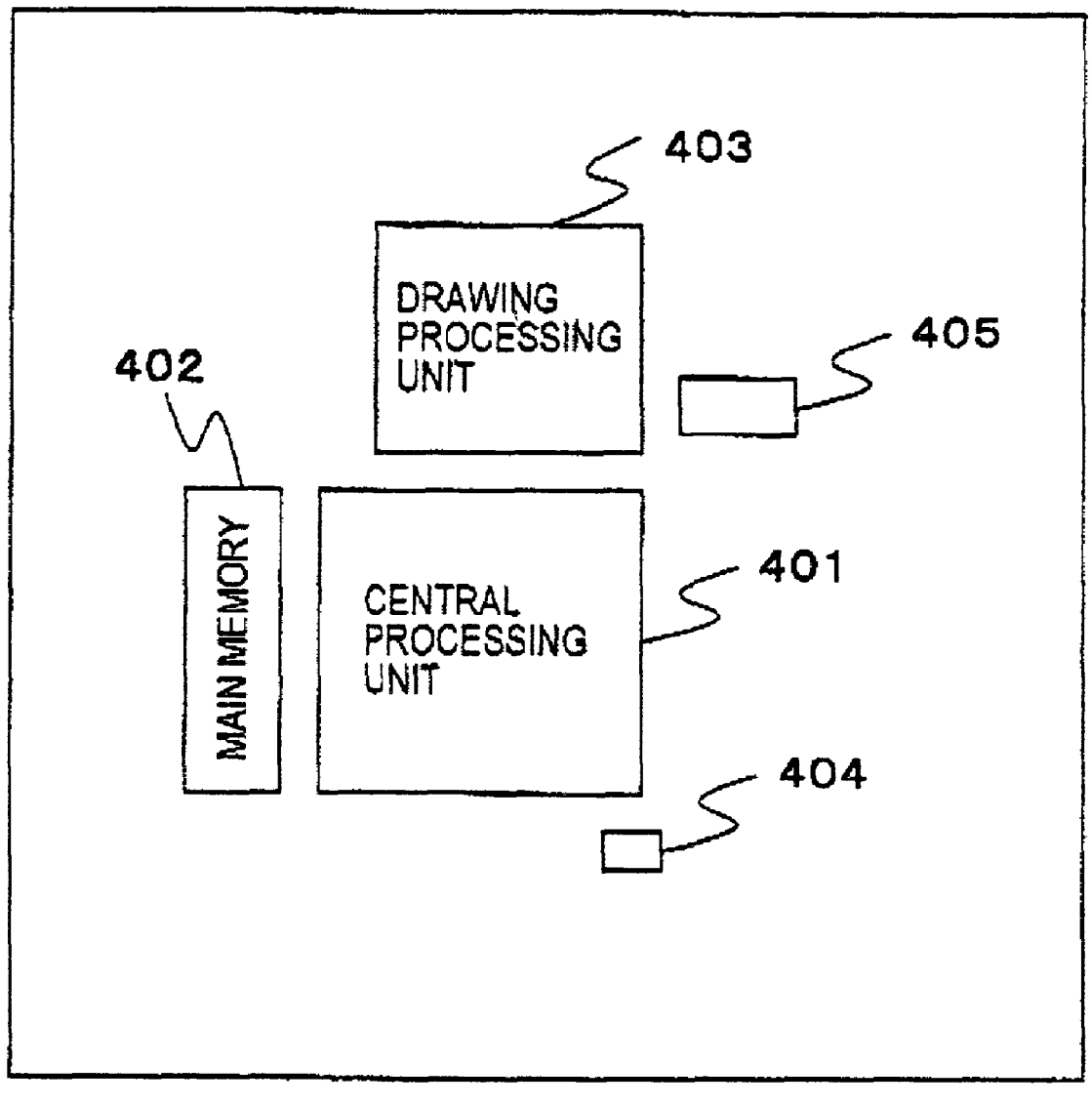

As shown in FIG. 7, the central processing unit 401, a main memory 402 and a drawing processing unit 403 as major parts are arranged on the main substrate 381a. A temperature sensor 404 is provided in the vicinity of the central processing unit 401. Further, a connector 405 for an electrical connection with the power source substrate 381b is provided on the main substrate 381a.

Many of the parts including the central processing unit 401, arranged on the main substrate 381a, generate heat during operation. Since a temperature increase due to accumulation of the heat in these parts causes operation errors and shortening of lifetime of these parts, a countermeasure such as heat dissipation by the heat sink 307, the radiation fin 306 and the cooling fan 305 is required.

Figure 8:
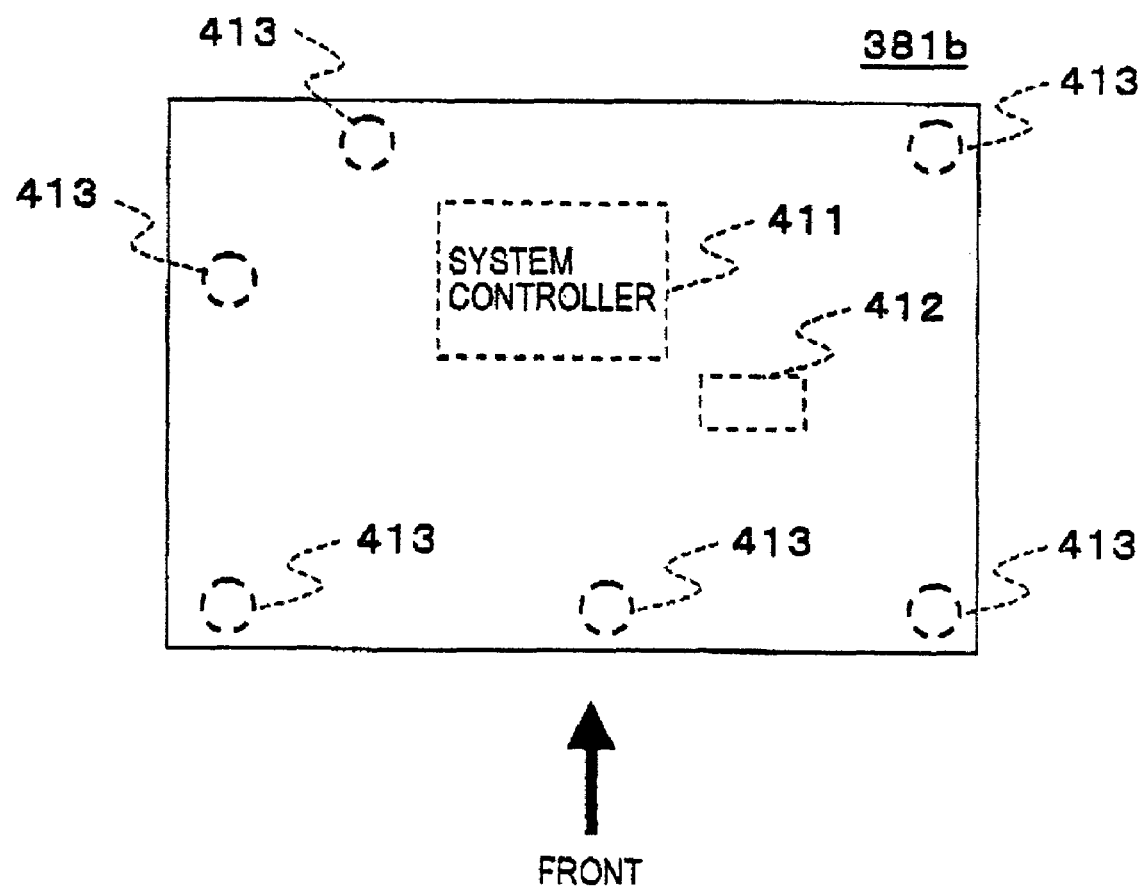
FIG. 8 is a schematic view of layout of major parts of a power source substrate 381b.

As shown in FIG. 8, the power source substrate 381b is provided with a system controller 411 for controlling voltages supplied to each of the apparatuses in the entertainment apparatus and a connector 412 used for an electrical connection with the main substrate 381a.

The system controller 411 monitors temperature which is measured by the temperature sensor 404 provided in the vicinity of the central processing unit 401, and supplies the cooling fan 305 with a voltage in response to the measured temperature. Specifically, when the temperature increases, a voltage is supplied to the cooling fan 305 so that a revolution speed of the cooling fan 305 becomes higher to enhance cooling effects. On the other hand, when the temperature drops, the system controller 411 supplies a voltage to the cooling fan 305 so that the revolution speed of the cooling fan 305 becomes lower to reduce noise from the cooling fan 305.

FIG. 8 shows a state where the power source substrate 381*b* is viewed from above, and the system controller 411 and the connector 412 are arranged on the back of the power source substrate 381*b*. FIG. 8 therefore uses broken lines to illustrate the layout of the system controller 411 and the connector 412. Circles 413 shown by broken lines show locations where the power source substrate 381*b* contacts with spacers 414 of the heat sink 307 to be described later.

Figure 9:
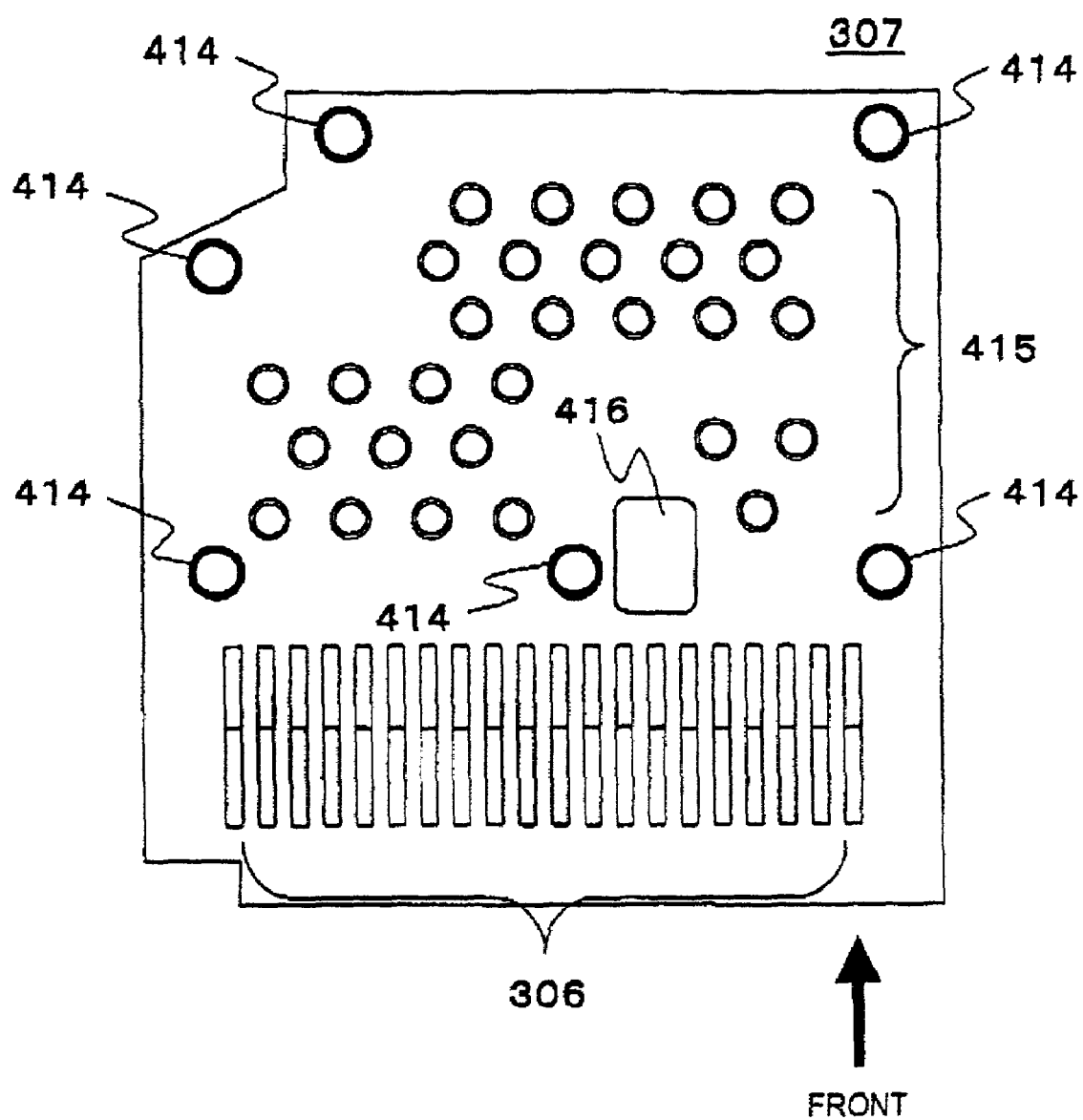
FIG. 9 is a schematic view showing a heat sink 307 from above.
Figure 10:
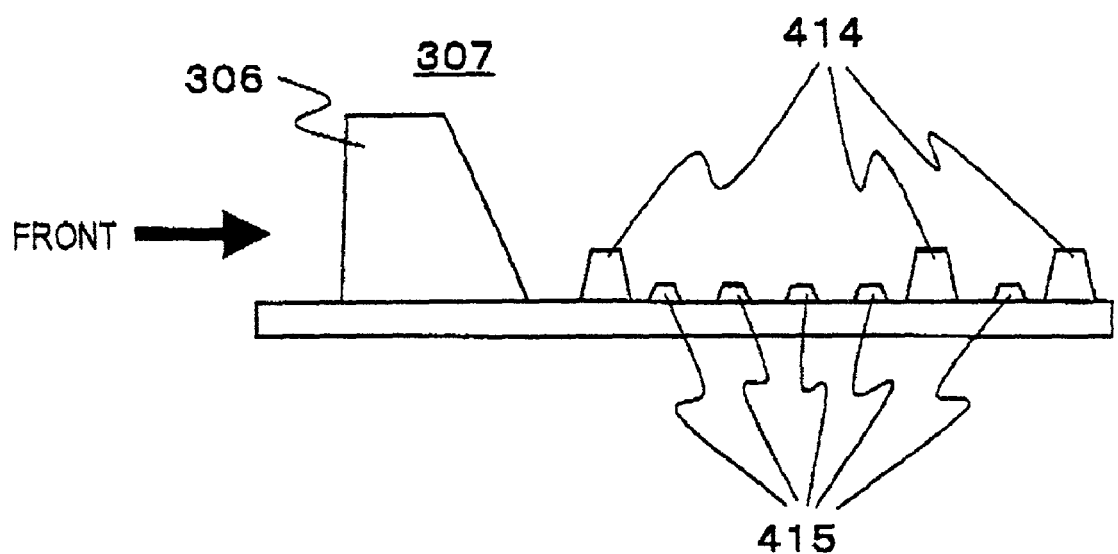
FIG. 10 is a schematic view showing the heat sink 307 from the side.
Figure 11:
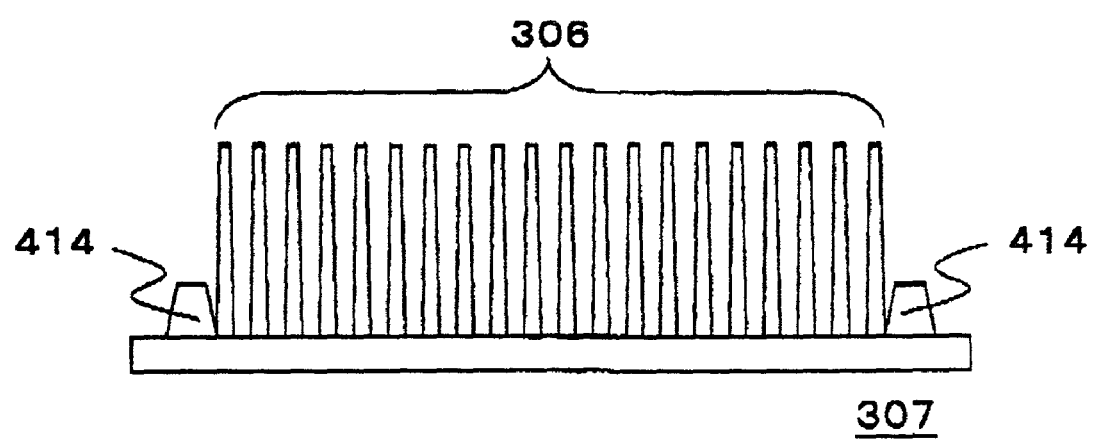
FIG. 11 is a schematic view showing the heat sink 307 from the front.

The heat sink 307 is integrated with the radiation fin 306. FIG. 9 is a schematic view showing the heat sink 307 from above. FIG. 10 is a schematic view showing the heat sink 307 from the side. Moreover, FIG. 11 is a schematic view showing the heat sink 307 from the front.

As shown in these drawings, the radiation fin 306 is constituted by an arrangement of a plurality of trapezoidal fins. On the heat sink 307, provided are the plurality of spacers 414 for securing a space between the heat sink 307 and the power source substrate 381*b*, and a plurality of protruding portions 415 for enlarging a surface area of the heat sink 307 so as to enhance the radiation effects. Particularly, a large number of the protruding portions 415 are provided. When these protruding portions 415 contact with the heat source, the protruding portions 415 can be allowed to play a role in absorbing the heat generated at the heat source and conducting the heat to the body of the heat sink 307. For this reason, each of the protruding portions 415 has a flat surface at its tip end. In FIG. 10, while each of the protruding portions 415 has a conical trapezoid shape, the shape thereof is not limited thereto. For example, each protruding portions 415 may have a cylindrical shape. In this embodiment, while the protruding portions 415 are provided only on one side of the heat sink 307, they may be provided on both sides of the heat sink 307.

Figure 12:
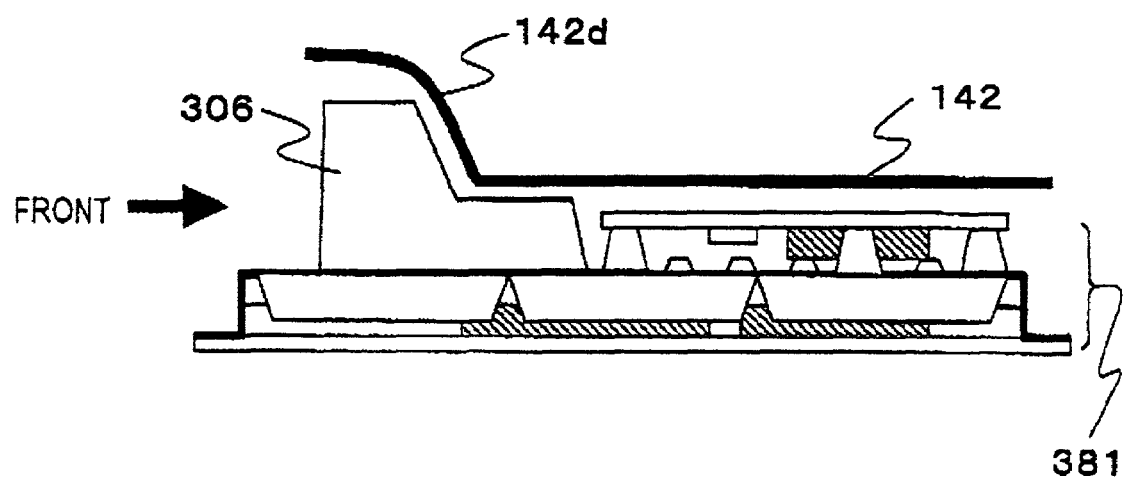
FIG. 12 is a schematic view showing the main board 381 using an L-shaped radiation fin 306 from the side.

The reason why the fins of the radiation fin 306 is made to be trapezoidal is that it is taken into account that the radiation fin 306 can have a surface area as large as possible without contacting with the power source substrate 381*b* and the hood 142*d*. The shape of the fins is not limited to the trapezoid. For example, when the power source substrate 381*b* is made to be more compact-sized, it is possible to further increase the surface area by making an L-shaped radiation fin 306 as shown in FIG. 12. In any case, the radiation fin 306 has a shape in which a large number of thin fins are arranged. Therefore, only a small number of steps of die-casting are necessary in casting the radiation fin 306, while the radiation fin 306 can have a large surface area, so that it is possible to manufacture the heat sink 307 integrated with the radiation fin 306 at a low cost.

Further, the heat sink 307 is provided with a hole 416 for passing a signal line therethrough, which signal line connects the connector 405 (see FIG. 7) of the main substrate 381*a* and the connector 412 (see FIG. 8) of the power source substrate 381*b*.

Figure 13:
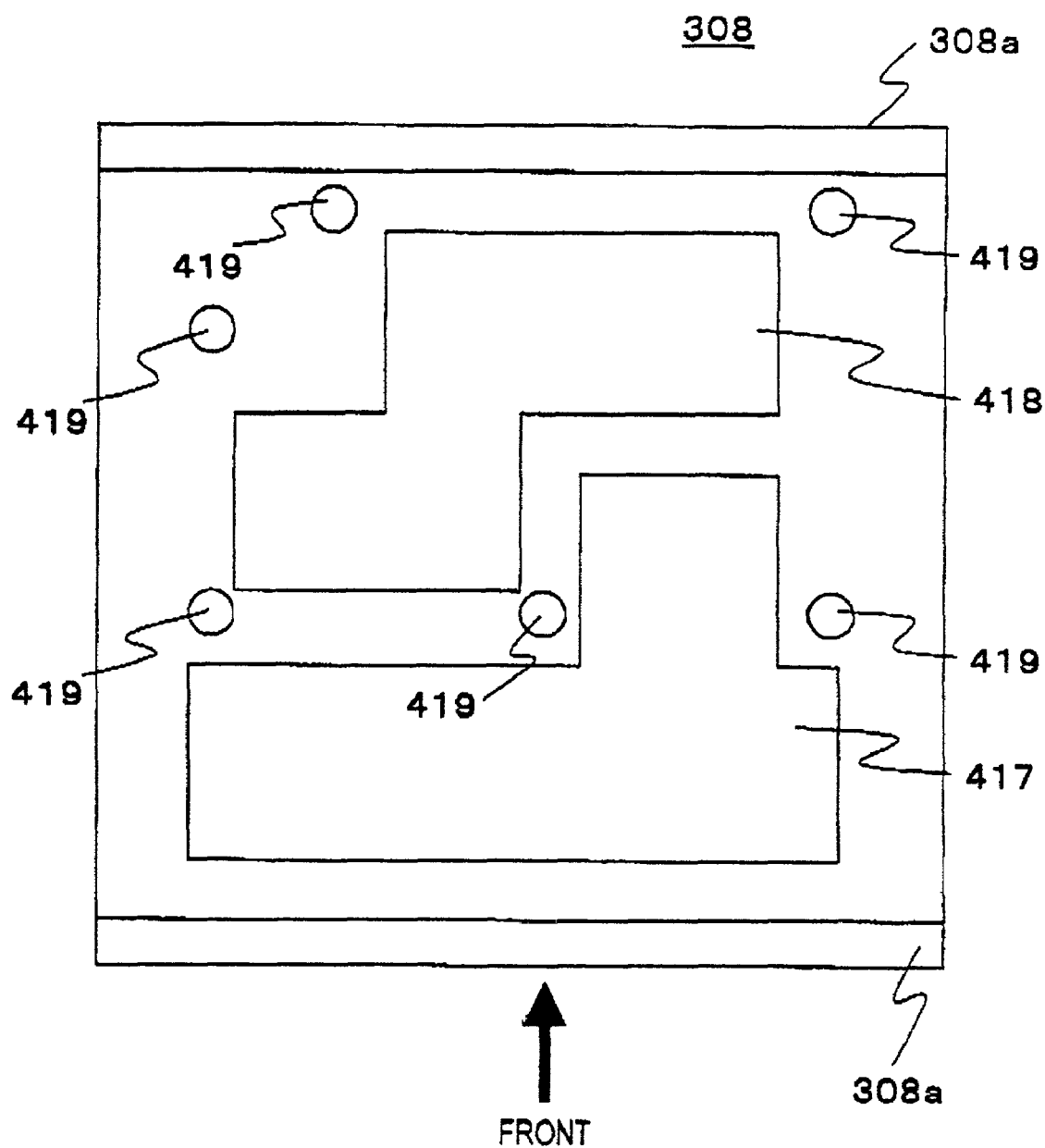
FIG. 13 is a schematic view showing a shield 308 from above.

The shield 308 has a shape so as to cover the heat sink 307, and is provided for the purpose of forming a shield against radiation noise from the main substrate 381*a*. FIG. 13 is a drawing showing the shield 308 from above. As shown in FIG. 13, the shield 308 has two large through holes provided therein, which include: a through hole 417 for allowing the radiation fin 306 and the protruding portions 415 of the heat sink 307 to penetrate therethrough; and a through hole 418 for allowing the protruding portions 415 of the heat sink 307 to penetrate therethrough. The shield 308 also has a small through hole 419 provided therein, which allows the spacers 414 of the heat sink 307 to penetrate therethrough. Further, the through hole 418 is capable of allowing the protruding portions 415 of the heat sink 307 to contact with the system controller 411 provided on the back of the power source substrate 381*b* arranged above the shield 308, thus conducting the heat generated by the system controller 411 to the heat sink 307. At this time, the system controller 411 and any of the heat sink 307 and the protruding portions 415 of the heat sink 307 may contact with each other via a heat conduction member.

Figure 14:
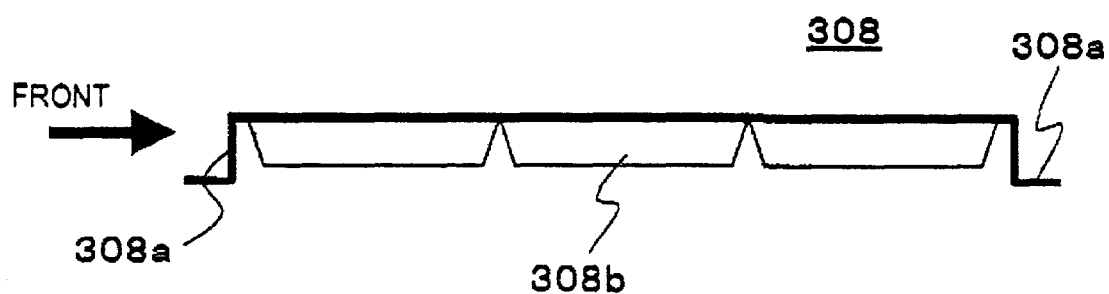
FIG. 14 is a schematic view showing the shield 308 from the side.

FIG. 14 is a drawing showing the shield 308 from the side. As shown in FIG. 14, foot portions 308*a* for fixing the shield 308 to the main substrate 381*a* are provided at the front and rear ends of the shield 308. A space is secured above the main substrate 381*a* by these foot portions 308*a*. Bent portions 308*b* for enhancing strength of the shield 308 are provided at the left and right ends of the shield 308. The bent portions 308*b* also play a role in protecting operators.

Figure 15:
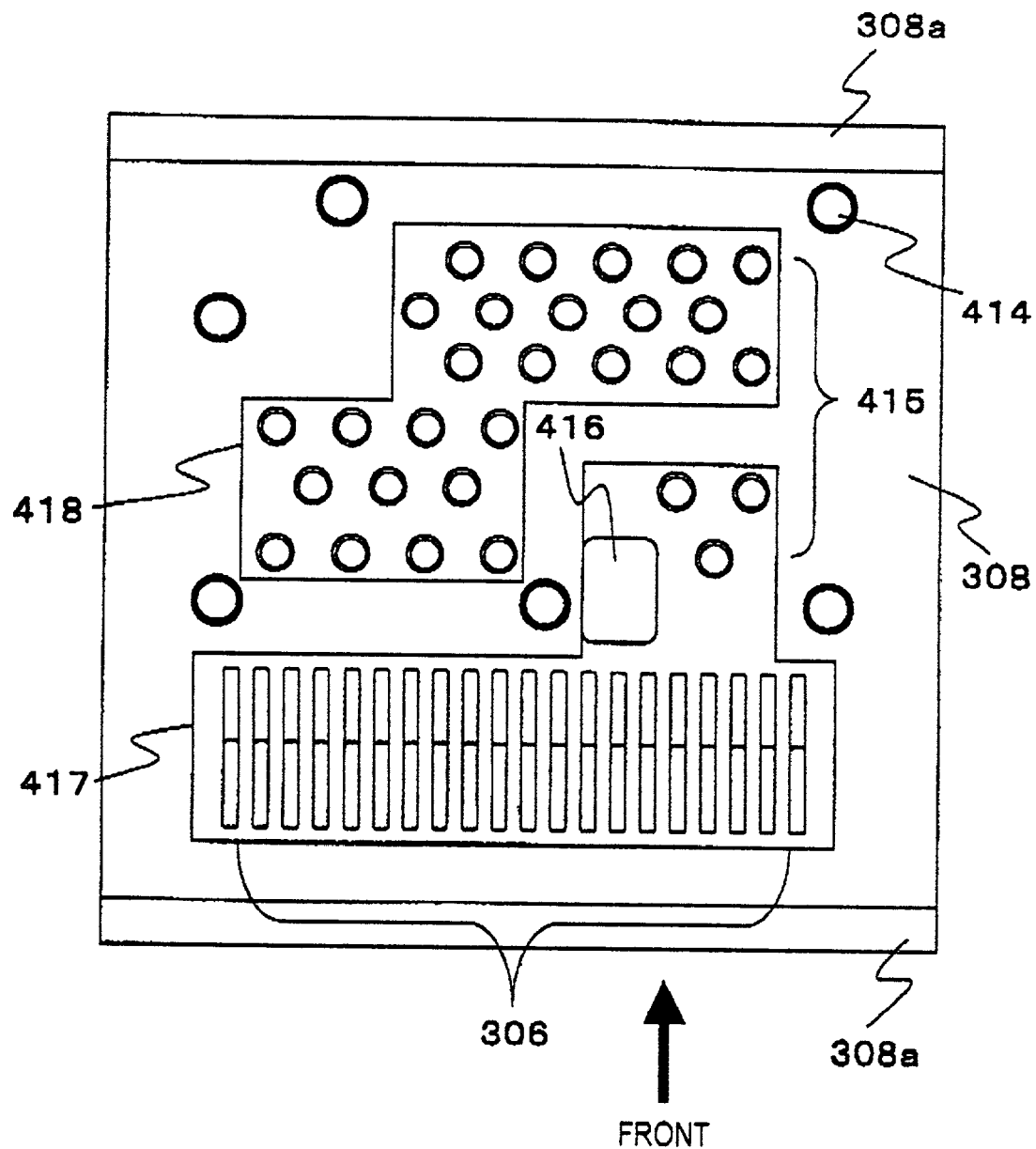
FIG. 15 is a schematic view showing the heat sink 307 being covered with the shield 308 and integrated with the same from above.
Figure 16:
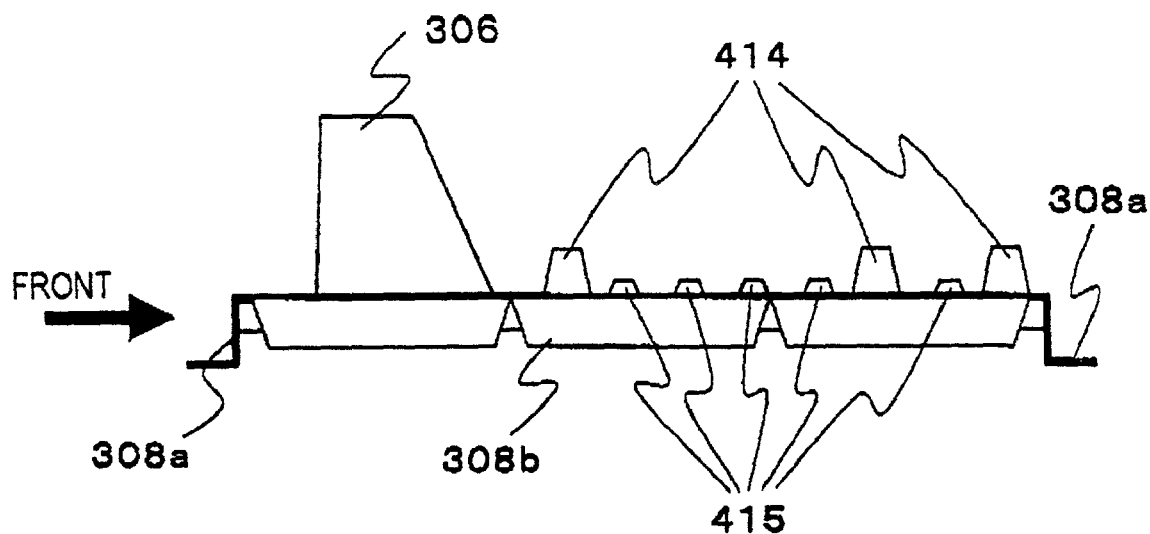
FIG. 16 is a schematic view showing the heat sink 307 being covered with the shield 308 and integrated with the same from the side.

FIG. 15 is a drawing showing a state from above where the heat sink 307 is covered with the shield 308. FIG. 16 is a drawing of the same viewed from the side. As shown in these drawings, the radiation fin 306, the spacers 414, the protruding portions 415, and the through hole 416 provided on the heat sink 307 pass through the plurality of through holes provided in the shield 308 to come out above the shield 308. The shield 308 and the heat sink 307 are fixed to each other to be integrated by a plurality of crimping portions (not shown).

The shield 308 and the heat sink 307 are integrated, and the resultant structure is sandwiched by the main substrate 381*a* and the power source substrate 381*b* to form the main board 381. Such a constitution is shown in FIG. 6 described above. As shown in FIG. 6, the foot portions 308*a* of the shield 308 are fixed to the vicinity of edges of the main substrate 381*a* by screws (not shown). Further, the power source substrate 381*b* is fixed to the spacers 414 provided in the heat sink 307 by screws (not shown).

Figure 17:
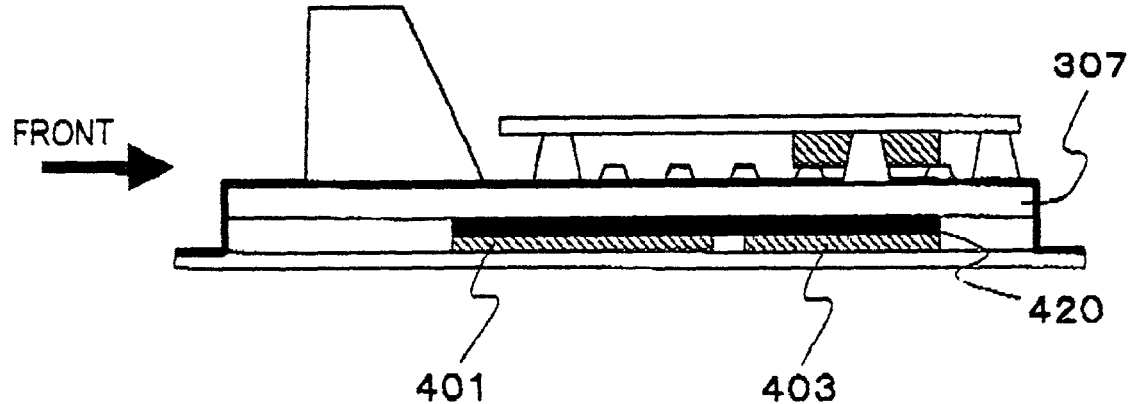
FIG. 17 is a cross-sectional view of the main board 381.

FIG. 17 is a cross-sectional view of the main board 381. As shown in this drawing, the central processing unit 401, the main memory 402 and the drawing processing unit 403 which are provided on the main substrate 381*a* and the heat sink 307 are in contact with each other via a heat conduction member 420. Since the parts such as the central processing unit 401 and the like particularly generate a large amount of heat, it is intended that the heat dissipation effect is further enhanced by allowing the heat to be conducted to the heat sink 307 through the heat conduction member 420 having high heat conductivity. As the heat conduction member 420, for example, highly heat-conductive rubber formed in a sheet shape can be employed. By employing such member showing elasticity at least in its thickness direction, adhesion of the heat conduction member 420 to the central processing unit 401 and the like can be enhanced, and the central processing unit 401 can be protected at the same time.

At this time, as shown in FIG. 7, the central processing unit 401 is disposed in front of the drawing processing unit 403. In other words, the central processing unit 401 is disposed near the ventilation ports 190 that are cooling air suction ports. It is therefore considered that the drawing processing unit 403 is harder to cool than the central processing unit 401 in terms of their locations. Therefore, when there is a possibility that thermal distribution in the periphery of the main substrate 381*a* is uneven, there may be employed a countermeasure in which the heat conduction member 420 contacting with the drawing processing unit 403 is divided and heat is more easily conducted to the heat sink 307 by use of a heat conduction member having higher heat conductivity than the heat conduction member 420 contacting with the central processing unit 401.

Adoption of such a countermeasure prevents unevenness of the thermal distribution in the periphery of the main substrate 381a. Moreover, by making the thermal distribution in the periphery of the main substrate 381a even, it is possible to estimate the temperature in the vicinity of the drawing processing unit 403 on the basis of the temperature measured by the temperature sensor 404 provided in the vicinity of the central processing unit 401.

Figure 18:
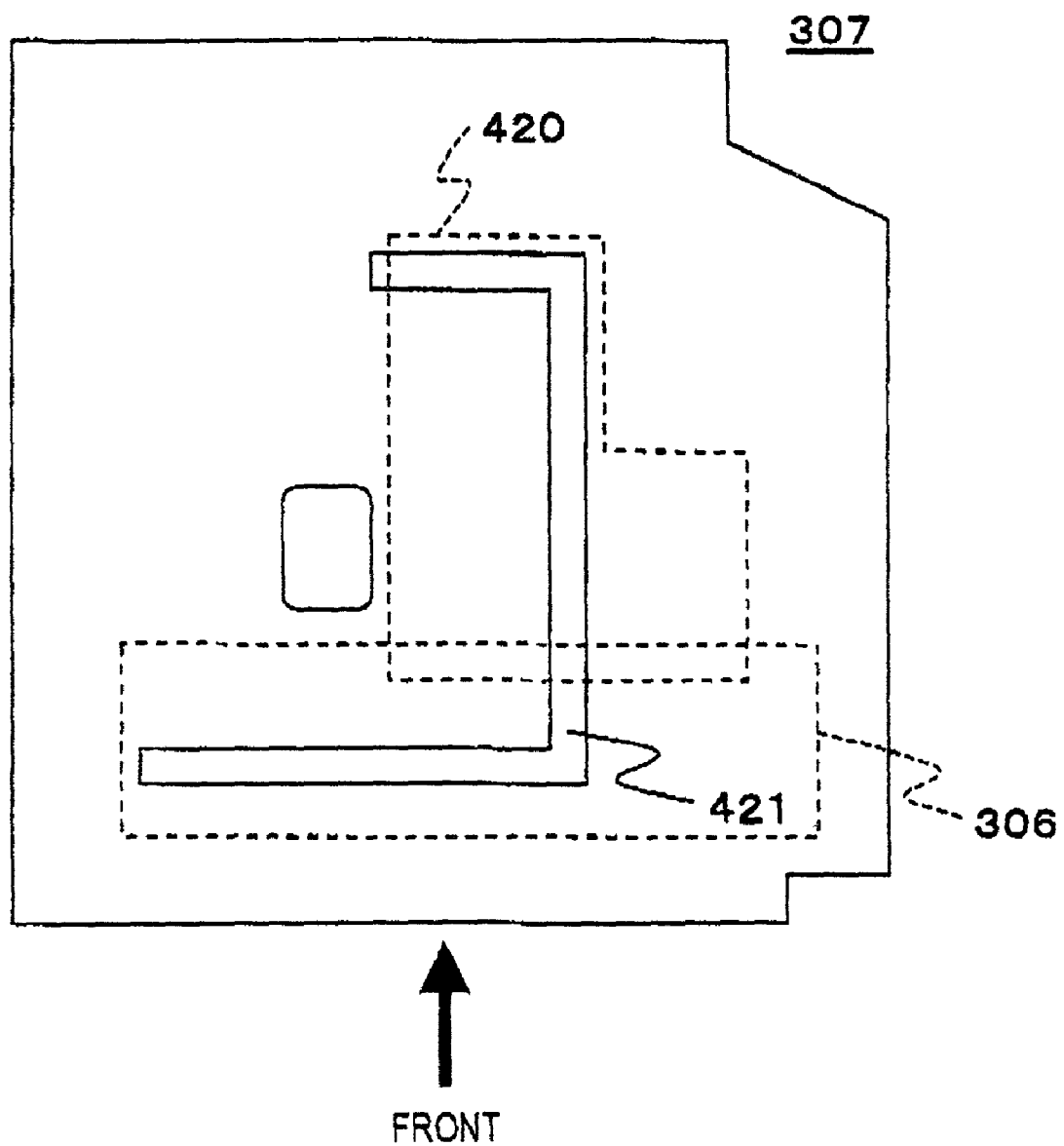
FIG. 18 is a schematic view showing the heat sink 307 from underneath.

A heat pipe 421 may be provided at a region of the heat sink 307 contacting with the heat conduction member 420 in order to promote the heat conduction to the radiation fin 306. FIG. 18 is a drawing showing the heat sink having the heat conduction member 420 and the heat pipe 421 provided therein from underneath. As shown in FIG. 18, the heat pipe 421 is effective when provided to reach the position of the radiation fin 306 along the heat conduction member 420. In FIG. 18, the portion (420) illustrated by broken lines is a region where the heat conduction member 420 is disposed, and the portion (306) illustrated by broken lines is a region where the radiation fin 306 is disposed at the position of the upper plane corresponding thereto.

Figure 19:
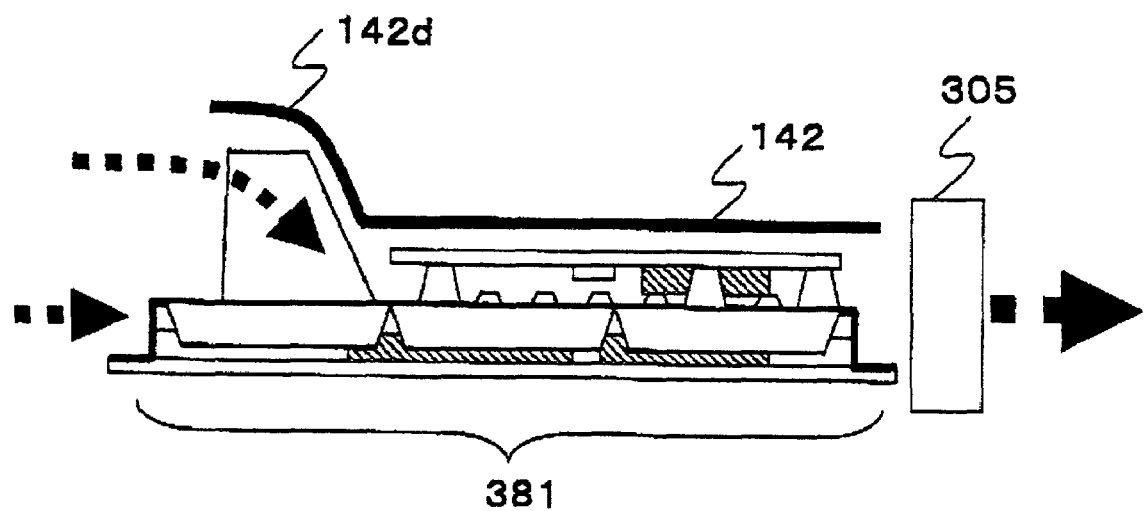
FIG. 19 is an explanatory view for explaining a positional relationship between the main board 381 and the intermediate plate 142, and airflow.

The main board 381 and the intermediate plate 142 are fixed to each other in a positional relation as shown in FIG. 19. While heat is generated due to operations of the central processing unit 401 and the like provided on the main substrate 381a, this heat is conducted to the heat sink 307 and further conducted to the radiation fin 306.

At this time, the air taken in from the ventilation ports 190 provided on the front plate of the casing and from the spaces such as slots provided on the front plane thereof passes between the fins of the radiation fin 306 as shown by the arrows in FIG. 19. The air then absorbs the heat of the radiation fin 306. The air is collected in the direction of the main board 381 by the hood 142d, and exhausted from the cooling fan 305. In such a manner, an amount of the air supplied to the main board 381 is increased by the hood 142d, and thus it is possible to enhance air-cooling efficiency for the central processing unit 401 and the like. Naturally, if an amount of the air sufficient for cooling the main board 381 is secured by the effect of the cooling fan 305, the hood 142d may be omitted. If this is the case, the step of processing the intermediate plate 142 can be omitted as well.

The entertainment apparatus according to this embodiment can be used as a game apparatus as one of its applications. The entertainment apparatus according to this embodiment constitutes a game apparatus with a body 1, a controller attached to the body 1, and a display device such as a TV receiver. The entertainment apparatus according to this embodiment is not limited to the game apparatus, but can be also used as an audio reproducing apparatus, a video reproducing apparatus, a communication apparatus, a computing apparatus and the like.

As described above, according to the present invention, parts of electronic equipment can be efficiently arranged in a limited space. According to the present invention, further, the parts of the electronic equipment can be effectively cooled.

What is claimed is:

1. A circuit substrate unit for mounting a circuit element, which comprises:
   a plurality of circuit substrates, each of which mounts a circuit element thereon; and
   at least one heat sink member;
   wherein at least one of said plurality of circuit substrates is stacked on one of the circuit substrates adjacent thereto with a space therebetween and said heat sink member is arranged in the space formed between said adjacent circuit substrates and
   wherein said heat sink member has a plurality of frustoconically-shaped protruding portions on at least one plane facing one of said adjacent circuit substrates which sandwich said heat sink member therebetween, and
   a circuit element arranged on a plane of the one adjacent circuit substrate facing said heat sink member and being mounted on the circuit substrate in a state where the circuit element contacts with at least one of said plurality of frustoconically-shaped protruding portions.

2. The circuit substrate according to claim 1, further comprising:
   a heat conduction member,
   wherein said heat conduction member is disposed between said circuit element which needs to be cooled and said heat sink member.

3. The circuit substrate according to claim 2,
   wherein said heat conduction member is disposed between a plane of said heat sink member which plan has no protruding portions and said circuit element which needs to be cooled, the circuit element being disposed on a plane of said circuit substrate which faces the plane of said heat sink.

4. The circuit substrate unit according to claim 2,
   wherein said heat conduction member is formed in a sheet shape, and has elasticity at least in a thickness direction thereof.

5. The circuit substrate according to claim 1,
   wherein each of said protruding portions has a flat surface on a tip end thereof.

6. The circuit unit according to claim 1,
   wherein others of said plurality of protruding portions are arranged to make no contact with the circuit element mounted on the circuit substrate facing the protruding portions.

7. The circuit substrate unit according to claim 1,
   wherein said heat sink member has a radiation fin partially provided therein.

8. Electronic equipment comprising
   a circuit substrate unit having:
      a first circuit substrate;
      a second circuit substrate;
      a heat sink member; and
      an electronic shield member;
      a circuit element on said first circuit substrate serving as a first heat source,
      a circuit element on said second circuit substrate serving as a second heat source,
      a radiation fin on a plane of said heat sink member facing the second circuit substrate, and
      a plurality of frustoconically-shaped protruding portions on the plane of said heat sink member facing the second circuit substrate;
      wherein said first circuit substrate and said second circuit substrate sandwich said heat sink member and said electromagnetic shield member therebetween; and
   wherein said circuit element to serve as a second heat source contacts with said heat sink member via at least one of the plurality of frustoconically-shaped protruding portions provided on the plane facing the second circuit substrate.

9. Electronic equipment comprising the circuit substrate unit according to claim 8, said circuit substrate unit further comprising:

a hood portion, wherein said hood portion is disposed at a position above said radiation fin so as to cover the radiation fin.

10. The electronic equipment according to claim 9, wherein a casing accommodating constituent components of the electronic equipment has an upper easing, a lower casing, and a plate member partitioning said upper and lower casings, and said circuit substrate unit is accommodated in the lower casing, and said hood portion is provided in said plate member.

11. The electronic equipment according to claim 10, further comprising:

a cooling fan, wherein said hood portion has an opening portion facing one plane of said casing, and a ventilation port is provided on the plane of said casing facing the opening portion of said hood portion, and said cooling fan is provided at a position abutting on a plane facing the plane of said casing.

12. The electronic equipment according to claim 8, wherein a casing accommodating constituent components of the electronic equipment has an upper casing, a lower casing and a plate member partitioning the upper and lower casings, and said circuit substrate unit is accommodated in the lower casing, and said plate member has a through hole therein for allowing an upper portion of said radiation fin to protrude to said upper casing.

13. The electronic equipment according to claim 10 or 12, wherein said circuit substrate unit is disposed in a region on one of left and right sides of said lower casing.

14. The electronic equipment according to claim 13, comprising:

a space for accommodating related apparatuses, wherein said space is provided in the other region of said lower casing where said circuit substrate unit is arranged.

15. A circuit substrate unit comprising:

a first circuit substrate, a second circuit substrate;

a heat sink member; and an electromagnetic shield member;

wherein said first circuit substrate and said second circuit substrate sandwich said heat sink member and said electromagnetic shield member therebetween;

wherein said first circuit substrate having, mounted thereon, a circuit element to serve as a first heat source and a circuit element to serve as a second heat sources;

wherein a radiation fin and a plurality of frustoconically-shaped protruding portions are provided on a plane of said heat sink member facing the second circuit substrate;

wherein said second circuit substrate has, mounted thereon, a circuit element to serve as a third heat source, and circuit element to serve as a third heat source contacts with said heat sink member via at least one of said plurality of frustoconically-shaped protruding portions provided on the plane facing the second circuit substrate.

16. The circuit substrate according to claim 15, further comprising:

heat conduction members, wherein said circuit element to serve as the first heat source and said circuit element to serve as the second heat source respectively contact with said heat sink member via said heat conduction members, and the heat conduction member with which said circuit element to serve as the first heat source contacts and the heat conduction member with which said circuit element to serve as the second heat source contacts are heat conduction members with different heat conductivity.

17. The circuit substrate according to claim 16, wherein each of said heat conduction members is formed in a sheet shape and has elasticity at least in a thickness direction thereof.

18. The circuit substrate unit according to claim 15, wherein a heat pipe is provided in that region of said heat sink member with which said heat conduction member contacts.

19. The circuit substrate unit according to claim 15, wherein said shield member has a through hole therein, and said circuit element to serve as the third heat source contacts with said heat sink member via said through hole.

20. The circuit substrate unit according to claim 15, wherein said radiation fin is constituted by a plurality of fins, each of which has a side parallel to said heat sink member.

21. The circuit substrate unit of claim 15, said radiation fin comprising a plurality of trapezoidal fins in a comb-like arrangement in the vicinity of an edge of said heat sink member.

22. The circuit substrate unit of claim 15, further comprising a plurality of second frustoconically-shaped protruding portions on the plane of said heat sink member facing the second circuit substrate, ones of said plurality of second frustoconically-shaped protruding portions contacting and retaining said second circuit substrate at a position enabling said third heat source to contact at least one of said plurality of frustoconically-shaped protruding portions of said heat sink member.

* * * * *